(12) United States Patent
Ishikawa et al.

(10) Patent No.: US 10,893,601 B2
(45) Date of Patent: Jan. 12, 2021

(54) HEAT DISSIPATION CIRCUIT BOARD

(71) Applicant: MITSUBISHI MATERIALS CORPORATION, Tokyo (JP)

(72) Inventors: Fumiaki Ishikawa, Naka (JP); Kazuhiko Yamasaki, Naka-gun (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 16/488,663

(22) PCT Filed: Feb. 28, 2018

(86) PCT No.: PCT/JP2018/007507
§ 371 (c)(1),
(2) Date: Aug. 26, 2019

(87) PCT Pub. No.: WO2018/173668
PCT Pub. Date: Sep. 27, 2018

(65) Prior Publication Data
US 2020/0236774 A1    Jul. 23, 2020

(30) Foreign Application Priority Data

Mar. 23, 2017    (JP) .............................. 2017-057460

(51) Int. Cl.
*H05K 1/02*      (2006.01)
*H05K 1/05*      (2006.01)
(Continued)

(52) U.S. Cl.
CPC ......... *H05K 1/0201* (2013.01); *H05K 1/0306* (2013.01); *H05K 1/056* (2013.01);
(Continued)

(58) Field of Classification Search
CPC ................. H05K 1/0201; H05K 1/056; H05K 2201/0266; H05K 2201/0209; H05K 2201/0154
See application file for complete search history.

(56) References Cited

U.S. PATENT DOCUMENTS

2007/0116976 A1*  5/2007  Tan .......................... C08K 3/22
                                                     428/546
2011/0001418 A1*  1/2011  Tsai ....................... H05K 1/056
                                                     313/46
(Continued)

FOREIGN PATENT DOCUMENTS

CN    104470873 A   3/2015
EP    3196263 A1    7/2017
(Continued)

OTHER PUBLICATIONS

Machine Translatin: JP2014156545A, Published Aug. 28, 2014. Takashi et al.*
(Continued)

*Primary Examiner* — Ishwarbhai B Patel
(74) *Attorney, Agent, or Firm* — Locke Lord LLP; James E. Armstrong, IV; Nicholas J. DiCeglie, Jr.

(57) ABSTRACT

This heat dissipation circuit board includes a metal substrate, an insulating layer provided on at least one of the surfaces of the metal substrate, and a circuit layer provided on the opposite surface to the metal substrate of the insulating layer. The insulating layer contains a resin that is selected from polyimide, polyamide-imide, and the mixture thereof, and ceramic particles having a specific surface area of 10 m$^2$/g or more. The ceramic particles form agglomerates, and the amount of the ceramic particles is in the range of 5 vol % or more and 60 vol % or less.

2 Claims, 1 Drawing Sheet

(51) Int. Cl.
  *H05K 1/18* (2006.01)
  *H05K 1/03* (2006.01)
(52) U.S. Cl.
  CPC ....... *H05K 1/18* (2013.01); *H05K 2201/0154* (2013.01); *H05K 2201/0209* (2013.01); *H05K 2201/0266* (2013.01)

(56) References Cited

U.S. PATENT DOCUMENTS

2012/0193131 A1    8/2012  Kusakawa et al.
2016/0340191 A1*  11/2016  Ikemiya .............. C01B 21/0648

FOREIGN PATENT DOCUMENTS

| JP | 06-216484 A     | 8/1994  |
| JP | 10-087990 A     | 4/1998  |
| JP | 2003-318500 A   | 11/2003 |
| JP | 2014-031484 A   | 2/2014  |
| JP | 2014-156545 A   | 8/2014  |
| JP | 5650084 B2      | 1/2015  |
| JP | 5665846 B2      | 2/2015  |
| JP | 2017-057098     | 3/2017  |
| KR | 10-2011-0115624 A | 10/2011 |
| KR | 10-2012-0051282 A | 5/2012  |
| KR | 10-2013-0092298 A | 8/2013  |
| KR | 10-2017-0056548 A | 5/2017  |
| WO | 2016/092734 A1  | 6/2016  |
| WO | 2018/025538 A1  | 2/2018  |

OTHER PUBLICATIONS

Notice of Allowance dated Nov. 22, 2019, issued for the Korean patent application No. 10-2019-7019161 and English translation thereof.

T. Tanaka et al., "Toward High Thermal Conductivity Nano Micro Epoxy Composites with Sufficient Endurance Voltage," Journal of International Council on Electrical Engineering vol. 2, No. 1, 2012, pp. 90-98. (discussed in the spec).

International Search Report dated May 15, 2018, issued for PCT/JP2018/007507 and English translation thereof.

Office Action dated Jan. 21, 2020, issued for the Chinese patent application No. 201880008747.8 and a partial English translation of Search Report.

\* cited by examiner

HEAT DISSIPATION CIRCUIT BOARD

FIELD OF THE INVENTION

The present invention relates to a heat dissipation circuit board.

Priority is claimed on Japanese Patent Application No. 2017-057460, filed Mar. 23, 2017, the content of which is incorporated herein by reference.

BACKGROUND ART

A heat dissipation circuit board in which a circuit layer is laminated on a metal substrate via an insulating layer is used as a circuit board on which high heat generating electronic components are mounted. In the heat dissipation circuit board, heat generated in the electronic components is conducted to the metal substrate through the insulating layer, and the heat is radiated from the metal substrate. Therefore, the insulating layer is required to have a high withstand voltage property and low thermal resistance.

A withstand voltage $V_R$ of the insulating film is generally expressed by the following Equation (1), where h is a film thickness of the insulating film and $V_F$ is a withstand voltage per unit film thickness.

$$V_R = V_F \times h \quad (1)$$

On the other hand, the thermal resistance R of the insulating film is expressed by the following Equation (2), where h is the thickness of the insulating film and $\lambda$, is thermal conductivity of the insulating film.

$$R \propto h/\lambda \quad (2)$$

From the Equations (1) and (2), the thermal resistance R of the insulating film can be expressed by the following Equation (3).

$$R \propto V_R/(\lambda \times V_F) \quad (3)$$

From the above Equation (3), it can be seen that the thermal resistance R of the insulating film is proportional to the reciprocal of the withstand voltage $V_F$ per unit thermal thickness of the insulating film× the thermal conductivity $\lambda$. Therefore, in order to reduce the thermal resistance R of the insulating layer of the heat dissipation circuit board, it is important to increase a value of the withstand voltage $V_F$ per unit thermal thickness of the insulating layer× the thermal conductivity $\lambda$ (hereinafter, also referred to as a "performance value").

The insulating layer of the heat dissipation circuit board is generally formed of a resin composition containing a resin and an inorganic filler having thermal conductivity. A resin having a high withstand voltage property, heat resistance, chemical resistance, and mechanical strength such as a polyimide or a polyamide-imide is used as the resin. The inorganic filler preferably has a large particle diameter to improve the thermal conductivity. However, it is known that, when an inorganic filler having a large particle diameter is added, there is a problem that the withstand voltage (a dielectric breakdown voltage) per unit film thickness decreases (Non-Patent Document 1).

Patent Document 1 discloses the use of a filler-containing polyimide resin layer in which a thermally conductive filler is dispersed in a polyimide having a specific structure as the insulating layer of the heat dissipation circuit board. Patent Document 1 describes spherical alumina having an average particle diameter in a range of 0.5 to 10 μm as an example of the thermally conductive filler.

Patent Document 2 discloses the use of a filler-containing polyimide resin layer, in which a plate-shaped filler having an average long diameter DL of 0.1 to 2.4 μm and a spherical filler having an average particle diameter DR of 0.05 to 5.0 μm are contained as thermally conductive fillers, as the insulating layer of a heat dissipation circuit board.

CITATION LIST

Patent Document 1: Japanese Patent No. 5650084
Patent Document 2: Japanese Patent No. 5665846
Non-Patent Document 1: Journal of International Council on Electrical Engineering Vol. 2, No. 1, pp. 90-98, 2012

SUMMARY OF INVENTION

Technical Problem

With recent advancement of performance and miniaturization of electronic devices, an amount of power used and an amount of heat generation of electronic components tend to increase, and improvement in heat radiation performance of the heat dissipation circuit board is required. Therefore, in the insulating layer of the heat dissipation circuit board, it is necessary to improve the withstand voltage per unit film thickness and to improve the thermal conductivity.

However, according to a study by the inventors, in the insulating layer described in Patent Documents 1 and 2, it is difficult to improve both a withstand voltage property and a thermal conductivity in a balanced manner, and the heat radiation performance may not be sufficient.

This invention is made in view of the above-described situation, and an object thereof is to provide a heat dissipation circuit board having high heat radiation performance.

Solution to Problem

In order to solve the above-described problems, the inventors of the present invention focused on and examined a specific surface area which is an indicator of the particle diameter of the inorganic filler contained in the insulating layer and an agglomeration state of the particles. As a result, they found that, in a heat dissipation circuit board with an insulating layer containing ceramic particles having a large specific surface area in a state in which agglomerated particles are formed, both the withstand voltage property and the thermal conductivity are improved in a balanced manner, and a high performance value, that is, high heat radiation performance, is provided.

A heat dissipation circuit board according to the present invention includes a metal substrate, an insulating layer which is disposed on at least one surface of the metal substrate, and a circuit layer which is disposed on a surface of the insulating layer opposite to the metal substrate. The insulating layer includes a resin formed of a polyimide, a polyamide-imide, or a mixture thereof, and ceramic particles having a specific surface area of 10 m²/g or more, the ceramic particles form agglomerated particles, and an amount of the ceramic particles is in a range of 5 vol % or more and 60 vol % or less.

According to the above-described heat dissipation circuit board, since the resin contained in the insulating layer is formed of a polyimide, a polyamide-imide, or a mixture thereof, the withstand voltage property, heat resistance, chemical resistance, and mechanical properties are improved.

Further, since the ceramic particles contained in the insulating layer are fine with a specific surface area of 10 m²/g or more, the withstand voltage property of the ceramic particles is improved, and the withstand voltage property of the insulating layer does not easily decrease even when added in large amounts. Also, since the fine ceramic particles contained in the insulating layer form the agglomerated particles, heat can be easily conducted between the primary particles of the ceramic particles, a heat conduction network structure can be easily formed, and thus thermal conductivity of the insulating layer is improved.

Furthermore, since the amount of ceramic particles in the insulating layer is in the range of 5 vol % or more and 60 vol % or less, it is possible to further improve the thermal conductivity without impairing the excellent withstand voltage property, heat resistance, chemical resistance and mechanical properties of the polyimide or polyamide-imide. Therefore, since the heat dissipation circuit board with such a constitution includes the insulating layer as described above, heat radiation performance is improved.

Effects of Invention

According to the present invention, it is possible to provide a heat dissipation circuit board having high heat radiation performance while maintaining a withstand voltage property, heat resistance, chemical resistance, and mechanical properties.

DESCRIPTION OF EMBODIMENTS

Hereinafter, an embodiment of a heat dissipation circuit board of the present invention will be described with reference to the attached drawings.

Figure 1:
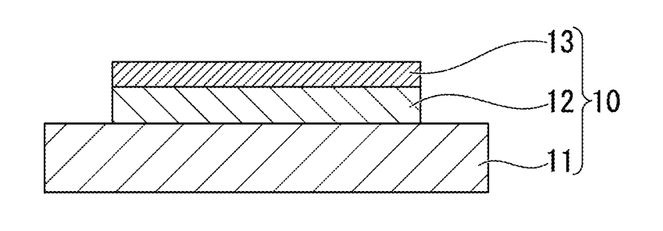
FIG. 1 is a cross-sectional view of a heat dissipation circuit board according to an embodiment of the present invention.

FIG. 1 is a cross-sectional view of a heat dissipation circuit board according to an embodiment of the present invention. In FIG. 1, the heat dissipation circuit board 10 includes a metal substrate 11, an insulating layer 12 disposed on a surface of the metal substrate 11 (an upper side in FIG. 1), and a circuit layer 13 disposed on a surface of the insulating layer 12 opposite to the metal substrate 11.

<Metal Substrate 11>

The metal substrate 11 is not particularly limited, and a normal substrate used as a substrate of a heat dissipation circuit board may be used as the metal substrate 11. The metal substrate 11 may be a plate formed of a composite material of a metal and a nonmetal material. Examples of the nonmetal material include ceramics and graphite. Examples of the metal substrate 11 include a copper plate, a copper alloy plate, an aluminum plate, an aluminum alloy plate, an iron plate, an AlSiC plate, a graphite aluminum composite plate, and so on. The thickness and the shape thereof are not particularly limited.

<Insulating Layer 12>

The insulating layer 12 includes a resin formed of a polyimide, a polyamide-imide, or a mixture thereof, and ceramic particles having a specific surface area of 10 m²/g or more. Some or all of the ceramic particles in the insulating layer 12 form agglomerated particles. The amount of the ceramic particles in the insulating layer 12 is in a range of 5 vol % or more and 60 vol % or less. When some of the ceramic particles form the agglomerated particles, non-agglomerated ceramic particles may be mixed therewith.

Polyimides and polyamide-imides have excellent heat resistance and mechanical properties because they have imide bonds. Therefore, in the embodiment, a polyimide, a polyamide-imide, or a mixture thereof is used as the resin of the insulating layer 12.

The mass average molecular weight of the polyamide-imide or polyimide is preferably 100,000 or more, and more preferably in a range of 100,000 or more and 500,000 or less. In the insulating layer 12 containing the polyamide-imide or polyimide having a mass average molecular weight in the above range, the heat resistance and the mechanical properties are further improved.

The ceramic particles have an effect of efficiently improving a performance value of the insulating layer 12. When the specific surface area of the ceramic particles is too small, that is, when the particle diameter of primary particles of the ceramic particles is too large, the withstand voltage property of the insulating layer 12 may be reduced. Therefore, in the embodiment, the specific surface area of the ceramic particles is set to 10 m²/g or more. In order to reliably improve the thermal conductivity of the insulating layer 12, the specific surface area of the ceramic particles is preferably 50 m²/g or more.

When the specific surface area of the ceramic particles becomes too large, that is, when the particle diameter of the primary particles of the ceramic particles becomes too small, the ceramic particles are likely to form excessively large agglomerated particles, and a surface roughness Ra of the insulating layer 12 may be increased. When the surface roughness Ra of the insulating layer 12 becomes excessively large, various problems may occur, for example, a contact area with the circuit layer 13 may be narrowed, the insulating layer 12 and the circuit layer 13 may be easily peeled off, and it may also be difficult to conduct the heat generated from the electronic components disposed on the circuit layer 13 to the metal substrate 11 through the insulating layer 12, or the like. Thus, the surface roughness Ra of the insulating layer 12 is preferably small. In order to prevent the surface roughness Ra of the insulating layer 12 from becoming excessively large, the specific surface area of the ceramic particles is preferably 300 m²/g or less.

The specific surface area of the ceramic particles is a BET specific surface area measured by a BET method. A specific measurement method is defined, for example, in JIS 8830. The specific surface area of the ceramic particles in the insulating layer 12 can be measured by heating the insulating layer 12, thermally decomposing and removing a resin component and recovering the remaining ceramic particles.

In the ceramic particles, a BET diameter calculated from a BET specific surface area and a density using the following equation is preferably in a range of 1 nm or more and 200 nm or less. In the insulating layer 12 containing the ceramic particles having a BET diameter in the above range, the withstand voltage property is further improved.

$$\text{BET diameter} = 6/(\text{density} \times \text{BET specific surface area})$$

At least some of the ceramic particles form the agglomerated particles. The agglomerated particles may be agglomerates in which the primary particles are relatively weakly linked or may be aggregates in which the primary particles are relatively strongly linked. The agglomerated particles may form a particle assembly in which the agglomerated particles are further assembled. Since the primary particles of the ceramic particles form the agglomerated particles and are dispersed in the insulating layer 12, a network is formed by mutual contact between the ceramic particles, heat is easily conducted between the primary particles of the ceramic particles, and the thermal conductivity of the insulating layer 12 is improved.

The agglomerated particles of the ceramic particles preferably have a shape in which the primary particles are connected in point contact and have anisotropy. In this case, it is preferable that the primary particles of the ceramic particles be chemically strongly bonded to each other.

The average particle diameter of the agglomerated particles is preferably 5 times or more and preferably in a range of 5 times or more and 100 times or less the above-described BET diameter. The average particle diameter of the agglomerated particles is preferably in a range of 20 nm to 500 nm. When the average particle diameter of the agglomerated particles is in the above range, the thermal conductivity of the insulating layer 12 can be reliably improved.

The average particle diameter of the agglomerated particles is a value of Dv50 (50% of the diameter of a cumulative frequency distribution (on a volume basis)) measured by a laser diffraction type particle size distribution measuring device in an ultrasonic dispersion state of the ceramic particles in an NMP solvent together with a dispersant. The agglomerated particles (the ceramic particles) in the insulating layer 12 can be recovered by heating the insulating layer 12 and thermally decomposing and removing the resin component.

The amount of the ceramic particles in the insulating layer 12 is 5 vol % or more and 60 vol % or less. When the amount of the ceramic particles is too small, the thermal conductivity of the insulating layer 12 may not be sufficiently improved. When the amount of the ceramic particles is too large, the amount of the resin may be relatively reduced, and a shape of the insulating layer 12 may not be stably maintained. Further, the ceramic particles are likely to form excessively large agglomerated particles, and the surface roughness Ra of the insulating layer 12 may be increased.

The amount of the ceramic particles is preferably 10 vol % or more to reliably improve the thermal conductivity of the insulating layer 12. The amount of the ceramic particles is preferably 50 vol % or less to reliably improve the stability of the shape of the insulating layer 12 and to lower the surface roughness Ra.

Examples of the ceramic particles include silica (silicon dioxide) particles, alumina (aluminum oxide) particles, boron nitride particles, titanium oxide particles, alumina-doped silica particles, and alumina hydrate particles. The ceramic particles may be used alone or in a combination of two or more. Among the ceramic particles, the alumina particles are preferred in that they have high thermal conductivity.

The ceramic particles may be commercially available products. Silica particles such as AE50, AE130, AE200, AE300, AE380, and AE90E (all are trade names of Nippon Aerosil Co., Ltd.), T400 (a trade name of Wacker Chemie AG), SFP-20M (a trade name of Denka Company, Ltd.), alumina particles such as Alu65 (a trade name of Nippon Aerosil Co., Ltd.), boron nitride particles such as AP-170S (a trade name of Maruka Corporation, Ltd), titanium oxide particles such as AEROXIDE® $TiO_2$ P90 (a trade name of Nippon Aerosil Co., Ltd.), alumina-doped silica particles such as MOX170 (a trade name of Nippon Aerosil Co., Ltd.), and alumina hydrate particles manufactured by Sasol Ltd may be used as the commercially available products.

<Circuit Layer 13>

The circuit layer 13 is not particularly limited, and it may be formed of a normal material used as a circuit layer of a heat dissipation circuit board. Examples of the materials of the circuit layer 13 include copper, aluminum and alloys thereof.

<Method of Manufacturing Heat Dissipation Circuit Board 10>

The heat dissipation circuit board 10 of the embodiment may be manufactured, for example, by forming the insulating layer 12 on at least one surface of the metal substrate 11 and then forming the circuit layer 13 on a surface of the insulating layer 12 opposite to the metal substrate 11.

The insulating layer 12 may be formed, for example, by dissolving a polyimide or polyamide-imide or a precursor thereof in a solvent, preparing a ceramic particle-dispersed resin solution in which the ceramic particles forming the agglomerated particles having a specific surface area of 10 $m^2/g$ or more are dispersed, and then using the ceramic particle-dispersed resin solution. Examples of the solvent include aprotic polar solvents such as N-methyl-2-pyrrolidone (NMP), diglyme, triglyme, γ-butyrolactone, dimethylsulfoxide (DMSO), and so on, and mixed liquors thereof The ceramic particle-dispersed resin solution may be prepared by a method in which the ceramic particles are mixed with a resin solution in which a polyimide or polyamide-imide or a precursor thereof is dissolved in a solvent and then the ceramic particles are dispersed in the resin solution. Further, the ceramic particle-dispersed resin solution may be prepared by a method in which a polyimide, a polyamide-imide, or a precursor thereof is mixed with a ceramic particle-dispersed solution in which the ceramic particles are dispersed in a solvent and then the polyimide, polyamide-imide or precursor thereof is dissolved in the ceramic particle-dispersed solution. Furthermore, the ceramic particle-dispersed resin solution may be prepared by mixing a resin solution in which a polyimide or polyamide-imide or a precursor thereof is dissolved in a solvent with a ceramic particle-dispersed solution in which the ceramic particles are dispersed in a solvent.

As a method of forming the insulating layer 12 on the metal substrate 11, for example, an electrodeposition method or a coating method can be used.

The electrodeposition method is a method of forming the insulating layer 12 by forming an electrodeposition product on the metal substrate 11 by an electrodeposition coating method using an electrodeposition solution prepared by adding water to the ceramic particle-dispersed resin solution and then heating, drying and curing the electrodeposition product.

The coating method is a method of forming the insulating layer 12 by applying the ceramic particle-dispersed resin solution onto the metal substrate 11 to form a coated film, drying the coated film to form a dried film, and then heating and curing the dried film.

The circuit layer 13 may be formed, for example, by disposing a metal foil on the surface of the insulating layer 12 and subjecting an obtained laminated body to thermocompression bonding treatment while pressing the laminated body in a thickness direction thereof.

According to the heat dissipation circuit board 10 of the embodiment constituted as described above, since the resin contained in the insulating layer 12 is formed of a polyimide, a polyamide-imide, or a mixture thereof, a withstand voltage property, heat resistance, chemical resistance, and mechanical properties are improved.

Further, since the ceramic particles contained in the insulating layer 12 are fine with a specific surface area of 10 $m^2/g$ or more, the withstand voltage property of the ceramic particles is improved, and the withstand voltage property of the insulating layer 12 does not easily decrease even when added in large amounts. Also, since the fine ceramic particles contained in the insulating layer 12 form the agglomerated particles, heat can be easily conducted between the primary particles of the ceramic particles, a heat conduction network structure can be easily formed, and thus the thermal conductivity of the insulating layer 12 is improved.

Furthermore, since the amount of ceramic particles in the insulating layer 12 is in the range of 5 vol % or more and 60 vol % or less, it is possible to further improve the withstand voltage and the thermal conductivity without impairing the excellent withstand voltage property, heat resistance, chemical resistance and mechanical properties of the polyimide or polyamide-imide.

Therefore, since the heat dissipation circuit board 10 according to the embodiment includes the insulating layer 12 as described above, the withstand voltage property and heat radiation performance are improved.

As mentioned above, although an embodiment of this invention has been described in full detail, a concrete constitution is not restricted to this embodiment, and a design or the like in a range which does not deviate from the gist of this invention is included.

EXAMPLES

Hereinafter, the effects of the present invention will be described in detail using examples and comparative examples, but the present invention is not limited to the following examples.

Examples 1-1 to 1-20 and Comparative Examples 1-1 to 1-5

<Preparing of Ceramic Particle-Dispersed Resin Solution>

The ceramic particles and resins described in Table 1 below were prepared. The specific surface area of the ceramic particles described in Table 1 is a BET specific surface area measured by a BET method. The average particle diameter of the agglomerated particles is a value of Dv50 measured by a laser diffraction type particle size distribution measuring device (trade name: LA-950 manufactured by HORIBA Ltd.) in the ultrasonic dispersion state in the NMP N-methyl-2-pyrrolidone solvent together with a dispersant (sodium hexametaphosphate at 0.2 mass %).

1 g of the prepared ceramic particles was added to the mixed solvent containing 62.5 g of NMP, 10 g of 1M2P (1-methoxy-2-propanol), 0.22 g of aminoethanol (AE) and then sonicated for 30 minutes to prepare a ceramic particle-dispersed solution.

In addition, the prepared resin was dissolved in the NMP to prepare a resin solution.

The ceramic particle-dispersed resin solution was prepared by mixing the ceramic particle-dispersed solution and the resin solution at a ratio at which a ceramic particle concentration had the values described in Table 1 below. The ceramic particle concentration is the volume amount of the ceramic particles with respect to the total volume amount of the resin and the ceramic particles.

<Preparation of Electrodeposition Solution>

While the prepared ceramic particle-dispersed resin solution was stirred at a rotational speed of 5000 rpm, 21 g of water was dropped into the ceramic particle-dispersed resin solution, and an electrodeposition solution was prepared.

<Manufacturing of Heat Dissipation Circuit Board>

A 30 mm×20 mm copper plate having a thickness of 0.3 mm was prepared as a metal substrate. Also, a copper foil having a thickness of 18 μm (Fukuda Metal Foil & Powder Co., Ltd., trade name: CF-T4X-SV-18) was prepared as a material for the circuit layer.

The above copper plate was immersed in the prepared electrodeposition solution, a DC voltage of 100 V was applied by the electrodeposition method, and an electrodeposition product was formed on a surface of the copper plate to have a thickness of 25 μm after heating.

The electrodeposition product was heated at 250° C. for 3 minutes in an air atmosphere, and an insulating layer having a thickness of 10 μm was formed on the surface of the copper plate. The electrodeposition solution prepared in comparative example 1-3 and comparative example 1-5 could not form a uniform insulating layer. A film thickness was measured by filling the copper plate, on which the insulating layer had been formed, with a resin, then taking a cross section thereof and observing the cross section with a laser microscope.

Subsequently, the copper foil was disposed on the formed insulating layer, and the laminated body on which the copper plate, the insulating layer and the copper foil were laminated in this order was obtained. The obtained laminated body was heated in a vacuum at 250° C. for 20 minutes while a pressure of 5 MPa was applied in a thickness direction of the laminated body using a jig formed of carbon to perform a thermocompression bonding treatment, and the heat dissipation circuit board in which the copper substrate, the insulating layer and the circuit layer (the copper foil) were laminated in this order was manufactured.

<Evaluation>

In the heat dissipation circuit boards manufactured in the above-described examples and comparative examples, the amount of the ceramic particles, the withstand voltage (the withstand voltage in the thickness direction of the insulating layer) and the thermal conductivity (the thermal conductivity in the thickness direction of the insulating layer) were measured by the following method. The performance value (the withstand voltage $V_F$ per unit film thickness× heat conductivity $\lambda$) was calculated from the withstand voltage and the thermal conductivity. The results thereof are shown in Table 2. A relative value of each of the withstand voltage, the thermal conductivity and the performance value is a relative value in which a value measured using a heat dissipation circuit board on which a polyamide-imide layer having a thickness of 25 μm was formed in the same manner as in example 1-1 except that no ceramic particles were added is set to 1.

(Content of Ceramic Particles)

The copper plate and the circuit layer of the heat dissipation circuit board were peeled off, and the insulating layer was taken out. The insulating layer that was taken out was cut into a predetermined size to obtain a sample. The content (mass %) of the ceramic particles in the insulating layer was measured by thermo-gravimetric analysis (TG) using the sample. Additionally, the value of the amount of the ceramic particles was converted to volume % using densities of the ceramic particles and resins shown below.

(Measurement of Withstand Voltage)

The heat dissipation circuit board was cut to a size of 5 cm×5 cm, the copper substrate was machined into a circle having a diameter of 2 cm, and unnecessary portions thereof were removed with a copper foil etching solution. The withstand voltage was measured in an insulating oil (trade name: Florinert FC-770 manufactured by 3M Co., Ltd.) based on JIS C 2110 using the product TOS5101 manufactured by Kikusui Electronics Corp. An electrode plate was disposed on the surface of the circuit layer. The electrode plate disposed on the surface of each of the copper substrate and the circuit layer was connected to a power supply, and then a voltage was boosted to 8000 V in 30 seconds. A voltage at which a current value flowing between the copper plate and the electrode plate reached 8500 µA was defined as the withstand voltage. A value of this withstand voltage was divided by the film thickness of the insulating layer, and an obtained value was defined as the withstand voltage (an absolute value) per unit film thickness.

(Measurement of Thermal Conductivity)

The thermal conductivity (the thermal conductivity in the thickness direction of the insulating layer) was measured by a laser flash method using LFA 477 Nanoflash (trade name) manufactured by NETZSCH-Geratebau GmbH. For the measurement, a three-layer model in which interface thermal resistance was not considered was used. The thermal diffusivity of the copper substrate and the circuit layer was 117.2 mm$^2$/sec. A density of silica particles of 2.2 g/cm$^3$, a specific heat of silica particles of 0.76 J/gK, a density of alumina particles of 3.89 g/cm$^3$, a specific heat of alumina particles of 0.78 J/gK, a density of a boron nitride of 2.1 g/cm$^3$, a specific heat of the boron nitride of 0.8 J/gK, a density of an titanium oxide of 3.98 g/cm$^3$, a specific heat of the titanium oxide of 0.689 J/gK, a density of alumina 1% doped silica of 2.2 g/cm$^3$, a specific heat of the alumina 1% doped silica of 0.76 J/gK, a density of an alumina hydrate of 3.07 g/cm$^3$, a specific heat of the alumina hydrate of 1.02 J/gK, a density of polyimide of 1.4 g/cm$^3$, a specific heat of polyimide of 1.13 J/gK, a density of a polyamide-imide resin of 1.41 g/cm$^3$, and a specific heat of the polyamide-imide resin of 1.09 J/gK were used for calculation of the thermal conductivity of the insulating layer. The density and the specific heat of a mixture of the polyamide-imide and the polyimide were calculated from a composition ratio.

TABLE 1

| | | Ceramic particle | | | | | | | Ceramic particle concentration (vol %) of ceramic particle-dispersed resin solution |
|---|---|---|---|---|---|---|---|---|---|
| | | Material | Specific surface area (m$^2$/g) | Density (g/cm$^3$) | BET diameter (nm) | Average particle diameter of agglomerated particles (nm) | Average particle diameter of agglomerated particles/BET diameter | Resin Material | |
| Example | 1-1 | Silica | 200 | 2.2 | 13.6 | 200 | 14.7 | Polyamide-imide | 25 |
| | 1-2 | Alumina | 65 | 3.95 | 23.4 | 200 | 8.6 | Polyamide-imide | 25 |
| | 1-3 | Boron nitride | 170 | 2.1 | 16.8 | 50 | 3.0 | Polyamide-imide | 25 |
| | 1-4 | Titanium oxide | 50 | 4.23 | 28.4 | 200 | 7.1 | Polyamide-imide | 25 |
| | 1-5 | Alumina 1% doped silica | 170 | 2.2 | 16.0 | 200 | 12.5 | Polyamide-imide | 25 |
| | 1-6 | Alumina hydrate | 240 | 3.07 | 8.1 | 20 | 2.5 | Polyamide-imide | 25 |
| | 1-7 | Silica | 90 | 2.2 | 30.3 | 200 | 6.6 | Polyamide-imide | 25 |
| | 1-8 | Silica | 400 | 2.2 | 6.8 | 300 | 44.0 | Polyamide-imide | 25 |
| | 1-9 | Silica | 200 | 2.2 | 13.6 | 200 | 14.7 | Polyamide-imide | 8 |
| | 1-10 | Silica | 200 | 2.2 | 13.6 | 200 | 14.7 | Polyamide-imide | 20 |
| | 1-11 | Silica | 200 | 2.2 | 13.6 | 200 | 14.7 | Polyamide-imide | 30 |
| | 1-12 | Silica | 200 | 2.2 | 13.6 | 200 | 14.7 | Polyamide-imide | 50 |
| | 1-13 | Silica | 200 | 2.2 | 13.6 | 200 | 14.7 | Polyamide-imide | 60 |
| | 1-14 | Alumina | 65 | 3.95 | 23.4 | 200 | 8.6 | Polyamide-imide | 8 |
| | 1-15 | Alumina | 65 | 3.95 | 23.4 | 200 | 8.6 | Polyamide-imide | 20 |
| | 1-16 | Alumina | 65 | 3.95 | 23.4 | 200 | 8.6 | Polyamide-imide | 30 |
| | 1-17 | Alumina | 65 | 3.95 | 23.4 | 200 | 8.6 | Polyamide-imide | 50 |
| | 1-18 | Alumina | 65 | 3.95 | 23.4 | 200 | 8.6 | Polyamide-imide | 60 |
| | 1-19 | Silica | 200 | 2.2 | 13.6 | 200 | 14.7 | Polyimide | 25 |
| | 1-20 | Silica | 200 | 2.2 | 13.6 | 200 | 14.7 | Mixture of polyamide-imide and polyimide (1:1 by mass ratio) | 25 |
| Comparative example | 1-1 | Alumina | 9 | 3.95 | 168.8 | 200 | 1.2 | Polyamide-imide | 25 |
| | 1-2 | Silica | 200 | 2.2 | 13.6 | 200 | 14.7 | Polyamide-imide | 4 |
| | 1-3 | Silica | 200 | 2.2 | 13.6 | 200 | 14.7 | Polyamide-imide | 70 |
| | 1-4 | Alumina | 65 | 3.95 | 23.4 | 200 | 8.6 | Polyamide-imide | 4 |
| | 1-5 | Alumina | 65 | 3.95 | 23.4 | 200 | 8.6 | Polyamide-imide | 70 |

TABLE 2

| | | | Insulating layer | | | | | Evaluation Withstand voltage |
|---|---|---|---|---|---|---|---|---|
| | | | | Ceramic particle | | | | |
| | | Metal substrate | Material | Specific surface area (m$^2$/g) | Content (vol %) | Resin Material | Circuit layer | Measured value (kV) |
| Example | 1-1 | Copper plate | Silica | 200 | 25 | Polyamide-imide | Copper | 5.07 |
| | 1-2 | Copper plate | Alumina | 65 | 25 | Polyamide-imide | Copper | 5.32 |

TABLE 2-continued

|  |  | | | | | | | |
|---|---|---|---|---|---|---|---|---|
|  | 1-3 | Copper plate | Boron nitride | 170 | 25 | Polyamide-imide | Copper | 4.97 |
|  | 1-4 | Copper plate | Titanium oxide | 50 | 25 | Polyamide-imide | Copper | 4.87 |
|  | 1-5 | Copper plate | Alumina 1% doped silica | 170 | 25 | Polyamide-imide | Copper | 5.17 |
|  | 1-6 | Copper plate | Alumina hydrate | 240 | 25 | Polyamide-imide | Copper | 5.12 |
|  | 1-7 | Copper plate | Silica | 90 | 25 | Polyamide-imide | Copper | 5.02 |
|  | 1-8 | Copper plate | Silica | 400 | 25 | Polyamide-imide | Copper | 5.22 |
|  | 1-9 | Copper plate | Silica | 200 | 8 | Polyamide-imide | Copper | 5.52 |
|  | 1-10 | Copper plate | Silica | 200 | 20 | Polyamide-imide | Copper | 5.27 |
|  | 1-11 | Copper plate | Silica | 200 | 30 | Polyamide-imide | Copper | 5.17 |
|  | 1-12 | Copper plate | Silica | 200 | 50 | Polyamide-imide | Copper | 5.07 |
|  | 1-13 | Copper plate | Silica | 200 | 60 | Polyamide-imide | Copper | 4.92 |
|  | 1-14 | Copper plate | Alumina | 65 | 8 | Polyamide-imide | Copper | 5.77 |
|  | 1-15 | Copper plate | Alumina | 65 | 20 | Polyamide-imide | Copper | 5.62 |
|  | 1-16 | Copper plate | Alumina | 65 | 30 | Polyamide-imide | Copper | 5.32 |
|  | 1-17 | Copper plate | Alumina | 65 | 50 | Polyamide-imide | Copper | 5.27 |
|  | 1-18 | Copper plate | Alumina | 65 | 60 | Polyamide-imide | Copper | 4.92 |
|  | 1-19 | Copper plate | Silica | 200 | 25 | Polyimide | Copper | 5.17 |
|  | 1-20 | Copper plate | Silica | 200 | 25 | Mixture of polyamide-imide and polyimide (1:1 by mass ratio) | Copper | 5.12 |
| Comparative example | 1-1 | Copper plate | Alumina | 9 | 25 | Polyamide-imide | Copper | 4.12 |
|  | 1-2 | Copper plate | Silica | 200 | 4 | Polyamide-imide | Copper | 5.87 |
|  | 1-3 | Insulating layer is not formed | | | | | | |
|  | 1-4 | Copper plate | Alumina | 65 | 4 | Polyamide-imide | Copper | 5.87 |
|  | 1-5 | Insulating layer is not formed | | | | | | |

| | | | Evaluation | | | | |
|---|---|---|---|---|---|---|---|
| | | | Withstand voltage per unit film thickness | | Thermal conductivity | | Performance value |
| | | | Absolute value (kV/mm) | Relative value | Measured value (W/mK) | Relative value | Measured value | Relative value |
| Example | 1-1 | | 203 | 1.01 | 0.61 | 2.44 | 124 | 2.46 |
| | 1-2 | | 213 | 1.06 | 0.70 | 2.81 | 150 | 2.98 |
| | 1-3 | | 199 | 0.99 | 0.33 | 1.32 | 66 | 1.31 |
| | 1-4 | | 195 | 0.97 | 0.53 | 2.12 | 103 | 2.06 |
| | 1-5 | | 207 | 1.03 | 0.51 | 2.05 | 106 | 2.11 |
| | 1-6 | | 205 | 1.02 | 0.40 | 1.58 | 81 | 1.61 |
| | 1-7 | | 201 | 1.00 | 0.45 | 1.78 | 89 | 1.78 |
| | 1-8 | | 209 | 1.04 | 0.40 | 1.58 | 82 | 1.64 |
| | 1-9 | | 221 | 1.10 | 0.29 | 1.17 | 65 | 1.29 |
| | 1-10 | | 211 | 1.05 | 0.37 | 1.46 | 77 | 1.53 |
| | 1-11 | | 207 | 1.03 | 0.50 | 2.01 | 104 | 2.07 |
| | 1-12 | | 203 | 1.01 | 0.55 | 2.21 | 112 | 2.23 |
| | 1-13 | | 197 | 0.98 | 0.64 | 2.56 | 126 | 2.51 |
| | 1-14 | | 231 | 1.15 | 0.33 | 1.32 | 76 | 1.52 |
| | 1-15 | | 225 | 1.12 | 0.46 | 1.84 | 103 | 2.06 |
| | 1-16 | | 213 | 1.06 | 0.67 | 2.67 | 142 | 2.83 |
| | 1-17 | | 211 | 1.05 | 0.83 | 3.30 | 174 | 3.47 |
| | 1-18 | | 197 | 0.98 | 1.05 | 4.21 | 207 | 4.13 |
| | 1-19 | | 207 | 1.03 | 0.63 | 2.52 | 130 | 2.60 |
| | 1-20 | | 205 | 1.02 | 0.62 | 2.48 | 127 | 2.53 |

TABLE 2-continued

| | | | | | | | |
|---|---|---|---|---|---|---|---|
| Comparative | 1-1 | 165 | 0.82 | 0.36 | 1.45 | 60 | 1.19 |
| example | 1-2 | 235 | 1.17 | 0.25 | 1.00 | 59 | 1.17 |
| | 1-3 | | | Insulating layer is not formed | | | |
| | 1-4 | 235 | 1.17 | 0.25 | 0.99 | 59 | 1.16 |
| | 1-5 | | | Insulating layer is not formed | | | |

The performance value of the heat dissipation circuit board of the comparative example 1-1 was 1.19 times which was not sufficiently increased. It is presumed that this is because the withstand voltage is lowered when the specific surface area of the ceramic particles in the insulating layer is less than 10 m²/g.

The heat dissipation circuit boards of the comparative examples 1-2 and 1-4 also had performance values of about 1.17 times and 1.16 times. This is because the thermal conductivity of the insulating layer is equal to that of the polyamide-imide layer containing no filler and is low. It is presumed that the reason why the thermal conductivity is lower is because the amount of the ceramic particles is less than 5 vol %.

In the electrodeposition solution prepared in the comparative examples 1-3 and 1-5, the insulating layer could not be formed. It is presumed that this is because the amount of ceramic particles exceeds 60 vol %.

On the other hand, it can be understood that the heat dissipation circuit boards of the examples 1-1 to 1-20 have a performance value of 1.29 times to 4.13 times, and the performance is greatly improved. This is because the thermal conductivity was significantly improved as compared to the polyamide-imide layer in which the filter is not contained while the insulating layer maintained the same high withstand voltage as that of the polyimide-imide layer in which the filter is not contained.

Examples 2-1 to 2-31, Comparative Examples 2-1 to 2-16

(Synthesis of Polyamic Acid)

In a separable flask having a volume of 300 mL, 4,4'-diaminodiphenyl ether and NMP were charged. An amount of NMP was adjusted so that a concentration of the resulting polyamic acid was 40 wt %. After 4,4'-diaminodiphenyl ether is stirred at room temperature and completely dissolved, a predetermined amount of tetracarboxylic acid dianhydride was added little by little so that an internal temperature did not exceed 30° C. Then, the stirring was continued for 16 hours under a nitrogen atmosphere, and a polyamic acid solution was obtained.

(Preparation of Ceramic Particle-Dispersed Resin Solution)

The ceramic particles listed in Table 3 below were prepared. 1.0 g of the prepared ceramic particles was added to 10 g of NMP and then sonicated for 30 minutes to prepare a ceramic particle-dispersed solution.

Then, the polyamic acid solution, the ceramic particle-dispersed solution, and the NMP were mixed so that the concentration of the polyamic acid in the solution finally became 5 mass % and the concentration of the ceramic particles became a value described in Table 4 below. Subsequently, the obtained mixture was subjected to dispersion treatment by repeating high-pressure injection treatment at a pressure of 50 MPa 10 times using a trade name "Star Burst" manufactured by Sugino Machine Limited, and the ceramic particle-dispersed resin solution was prepared.

<Manufacturing of Heat Dissipation Circuit Board>

A 30 mm×20 mm copper plate having a thickness of 0.3 mm was prepared as a metal substrate. Also, a copper foil (CF-T4X-SV-18: a trade name of Fukuda Metal Foil & Powder Industry Co., Ltd.) having a thickness of 18 μm was prepared as a material of the circuit layer.

First, the prepared ceramic particle-dispersed resin solution was coated on the surface of the above-described copper plate to have a thickness of 25 μm after heating, and a coated film was formed. Then, the coated film was placed on a hot plate, heated from room temperature to 60° C. at 3° C./min, heated at 60° C. for 100 minutes, heated to 120° C. at 1° C./min, heated at 120° C. for 100 minutes and dried to form a dried film. Thereafter, the dried film was heated at 250° C. for 1 minute and at 400° C. for 1 minute, and thus an insulating layer having a thickness of 25 μm was formed on the surface of the copper plate. In the ceramic particle-dispersed resin solution prepared in the comparative examples 2-3, 2-5, 2-7, 2-9, and 2-16, the insulating layer could not be formed.

Subsequently, the copper foil was disposed on the formed insulating layer, and the laminated body in which the copper plate, the insulating layer, and copper foil were laminated in this order was obtained. The resulting laminated body was heated in a vacuum at 215° C. for 20 minutes while a pressure of 5 MPa was applied in the thickness direction of the laminated body using a jig formed of carbon to perform the thermocompression bonding treatment, and a heat dissipation circuit board in which the copper substrate, the insulating layer and the circuit layer (the copper foil) were laminated in this order was manufactured.

<Evaluation>

In the heat dissipation circuit boards manufactured in the above-described example and comparative example, the amount of the ceramic particles, the withstand voltage per unit film thickness and the thermal conductivity (the thermal conductivity in the thickness direction of the insulating layer) were respectively measured by the above-described method, and thus the performance values were calculated. The results thereof are shown in Table 4. The relative value of each of the withstand voltage, the thermal conductivity and the performance value is a relative value in which a value measured using a heat dissipation circuit board on which a polyimide layer having a thickness of 25 μm was formed in the same manner as in the example 2-1 except that no ceramic particles were added is set to 1.

TABLE 3

| | | Ceramic particle | | | | | | Ceramic particle concentration (vol %) of ceramic particle-dispersed resin solution |
|---|---|---|---|---|---|---|---|---|
| | | Material | Specific surface area (m²/g) | Density (g/cm³) | BET diameter (nm) | Average particle diameter of agglomerated particles (nm) | Average particle diameter of agglomerated particles/BET diameter | Resin Material | |
| Example | 2-1 | Silica | 200 | 2.2 | 13.6 | 200 | 14.7 | Polyimide | 25 |
| | 2-2 | Alumina | 65 | 3.95 | 23.4 | 200 | 8.6 | Polyimide | 25 |
| | 2-3 | Boron nitride | 170 | 2.1 | 16.8 | 50 | 3.0 | Polyimide | 25 |
| | 2-4 | Titanium oxide | 50 | 4.23 | 28.4 | 200 | 7.1 | Polyimide | 25 |
| | 2-5 | Alumina 1% doped silica | 170 | 2.2 | 16.0 | 200 | 12.5 | Polyimide | 25 |
| | 2-6 | Alumina hydrate | 240 | 3.07 | 8.1 | 20 | 2.5 | Polyimide | 25 |
| | 2-7 | Silica | 90 | 2.2 | 30.3 | 200 | 6.6 | Polyimide | 25 |
| | 2-8 | Silica | 400 | 2.2 | 6.8 | 300 | 44.0 | Polyimide | 25 |
| | 2-9 | Silica | 200 | 2.2 | 13.6 | 200 | 14.7 | Polyimide | 8 |
| | 2-10 | Silica | 200 | 2.2 | 13.6 | 200 | 14.7 | Polyimide | 20 |
| | 2-11 | Silica | 200 | 2.2 | 13.6 | 200 | 14.7 | Polyimide | 30 |
| | 2-12 | Silica | 200 | 2.2 | 13.6 | 200 | 14.7 | Polyimide | 50 |
| | 2-13 | Silica | 200 | 2.2 | 13.6 | 200 | 14.7 | Polyimide | 60 |
| | 2-14 | Alumina | 65 | 3.95 | 23.4 | 200 | 8.6 | Polyimide | 8 |
| | 2-15 | Alumina | 65 | 3.95 | 23.4 | 200 | 8.6 | Polyimide | 20 |
| | 2-16 | Alumina | 65 | 3.95 | 23.4 | 200 | 8.6 | Polyimide | 30 |
| | 2-17 | Alumina | 65 | 3.95 | 23.4 | 200 | 8.6 | Polyimide | 50 |
| | 2-18 | Alumina | 65 | 3.95 | 23.4 | 200 | 8.6 | Polyimide | 60 |
| | 2-19 | Boron nitride | 170 | 2.1 | 16.8 | 50 | 3.0 | Polyimide | 8 |
| | 2-20 | Boron nitride | 170 | 2.1 | 16.8 | 50 | 3.0 | Polyimide | 20 |
| | 2-21 | Boron nitride | 170 | 2.1 | 16.8 | 50 | 3.0 | Polyimide | 30 |
| | 2-22 | Boron nitride | 170 | 2.1 | 16.8 | 50 | 3.0 | Polyimide | 50 |
| | 2-23 | Boron nitride | 170 | 2.1 | 16.8 | 50 | 3.0 | Polyimide | 60 |
| | 2-24 | Silica | 50 | 2.2 | 54.5 | 300 | 5.5 | Polyimide | 25 |
| | 2-25 | Silica | 130 | 2.2 | 21.0 | 200 | 9.5 | Polyimide | 25 |
| | 2-26 | Silica | 300 | 2.2 | 9.1 | 100 | 11.0 | Polyimide | 25 |
| | 2-27 | Silica | 380 | 2.2 | 7.2 | 100 | 13.9 | Polyimide | 8 |
| | 2-28 | Silica | 380 | 2.2 | 7.2 | 100 | 13.9 | Polyimide | 20 |
| | 2-29 | Silica | 380 | 2.2 | 7.2 | 100 | 13.9 | Polyimide | 30 |
| | 2-30 | Silica | 380 | 2.2 | 7.2 | 100 | 13.9 | Polyimide | 50 |
| | 2-31 | Silica | 380 | 2.2 | 7.2 | 100 | 13.9 | Polyimide | 60 |
| Comparative example | 2-1 | Alumina | 9 | 3.95 | 169 | 200 | 12 | Polyimide | 25 |
| | 2-2 | Silica | 200 | 2.2 | 13.6 | 200 | 14.7 | Polyimide | 4 |
| | 2-3 | Silica | 200 | 2.2 | 13.6 | 200 | 14.7 | Polyimide | 70 |
| | 2-4 | Alumina | 65 | 3.95 | 23.4 | 200 | 8.6 | Polyimide | 4 |
| | 2-5 | Alumina | 65 | 3.95 | 23.4 | 200 | 8.6 | Polyimide | 70 |
| | 2-6 | Boron nitride | 170 | 2.1 | 16.8 | 50 | 3.0 | Polyimide | 4 |
| | 2-7 | Boron nitride | 170 | 2.1 | 16.8 | 50 | 3.0 | Polyimide | 70 |
| | 2-8 | Silica | 380 | 2.2 | 7.2 | 100 | 13.9 | Polyimide | 4 |
| | 2-9 | Silica | 380 | 2.2 | 7.2 | 100 | 13.9 | Polyimide | 70 |
| | 2-10 | Silica | 6.2 | 2.2 | 440 | 700 | 1.6 | Polyimide | 4 |
| | 2-11 | Silica | 6.2 | 2.2 | 440 | 700 | 1.6 | Polyimide | 8 |
| | 2-12 | Silica | 6.2 | 2.2 | 440 | 700 | 1.6 | Polyimide | 20 |
| | 2-13 | Silica | 6.2 | 2.2 | 440 | 700 | 1.6 | Polyimide | 30 |
| | 2-14 | Silica | 6.2 | 2.2 | 440 | 700 | 1.6 | Polyimide | 50 |
| | 2-15 | Silica | 6.2 | 2.2 | 440 | 700 | 1.6 | Polyimide | 60 |
| | 2-16 | Silica | 6.2 | 2.2 | 440 | 700 | 1.6 | Polyimide | 70 |

TABLE 4

| | | | Insulating layer | | | | | Evaluation Withstand voltage |
|---|---|---|---|---|---|---|---|---|
| | | | | Ceramic particle | | | | |
| | | Metal plate | Material | Specific surface area (m²/g) | Content (vol %) | Resin Material | Circuit layer | Measured valve (kV) |
| Examples | 2-1 | Copper plate | Silica | 200 | 25 | Polyimide | Copper | 5.47 |
| | 2-2 | Copper plate | Alumina | 65 | 25 | polyimide | Copper | 5.42 |
| | 2-3 | Copper plate | Boron nitride | 170 | 25 | Polyimide | Copper | 5.37 |

TABLE 4-continued

|  | | Substrate | Material | Value 1 | Value 2 | Resin | Metal | Measurement |
|---|---|---|---|---|---|---|---|---|
|  | 2-4 | Copper plate | Titanium oxide | 50 | 25 | Polyimide | Copper | 5.11 |
|  | 2-5 | Copper plate | Alumina 1% doped silica | 170 | 25 | Polyimide | Copper | 5.26 |
|  | 2-6 | Copper plate | Alumina hydrate | 240 | 25 | Polyimide | Copper | 5.21 |
|  | 2-7 | Copper plate | Silica | 90 | 25 | Polyimide | Copper | 5.47 |
|  | 2-8 | Copper plate | Silica | 400 | 25 | Polyimide | Copper | 5.57 |
|  | 2-9 | Copper plate | Silica | 200 | 8 | Polyimide | Copper | 5.99 |
|  | 2-10 | Copper plate | Silica | 200 | 20 | Polyimide | Copper | 5.68 |
|  | 2-11 | Copper plate | Silica | 200 | 30 | Polyimide | Copper | 5.63 |
|  | 2-12 | Copper plate | Silica | 200 | 50 | Polyimide | Copper | 5.42 |
|  | 2-13 | Copper plate | Silica | 200 | 60 | Polyimide | Copper | 5.16 |
|  | 2-14 | Copper plate | Alumina | 65 | 8 | Polyimide | Copper | 5.94 |
|  | 2-15 | Copper plate | Alumina | 65 | 20 | Polyimide | Copper | 5.68 |
|  | 2-16 | Copper plate | Alumina | 65 | 30 | Polyimide | Copper | 5.37 |
|  | 2-17 | Copper plate | Alumina | 65 | 50 | Polyimide | Copper | 5.26 |
|  | 2-18 | Copper plate | Alumina | 65 | 60 | Polyimide | Copper | 5.05 |
|  | 2-19 | Copper plate | Boron nitride | 170 | 8 | Polyimide | Copper | 5.31 |
|  | 2-20 | Copper plate | Boron nitride | 170 | 20 | Polyimide | Copper | 5.00 |
|  | 2-21 | Copper plate | Boron nitride | 170 | 30 | Polyimide | Copper | 4.95 |
|  | 2-22 | Copper plate | Boron nitride | 170 | 50 | Polyimide | Copper | 4.74 |
|  | 2-23 | Copper plate | Boron nitride | 170 | 60 | Polyimide | Copper | 4.22 |
|  | 2-24 | Copper plate | Silica | 50 | 25 | Polyimide | Copper | 5.94 |
|  | 2-25 | Copper plate | Silica | 130 | 25 | Polyimide | Copper | 6.51 |
|  | 2-26 | Copper plate | Silica | 300 | 25 | Polyimide | Copper | 5.68 |
|  | 2-27 | Copper plate | Silica | 380 | 8 | Polyimide | Copper | 6.41 |
|  | 2-28 | Copper plate | Silica | 380 | 20 | Polyimide | Copper | 5.57 |
|  | 2-29 | Copper plate | Silica | 380 | 30 | Polyimide | Copper | 5.26 |
|  | 2-30 | Copper plate | Silica | 380 | 50 | Polyimide | Copper | 5.00 |
|  | 2-31 | Copper plate | Silica | 380 | 60 | Polyimide | Copper | 4.64 |
| Comparative examples | 2-1 | Copper plate | Alumina | 9 | 25 | Polyimide | Copper | 4.06 |
|  | 2-2 | Copper plate | Silica | 200 | 4 | Polyimide | Copper | 6.25 |
|  | 2-3 | | | Insulating layer is not formed | | | | |
|  | 2-4 | Copper plate | Alumina | 65 | 4 | Polyimide | Copper | 6.15 |
|  | 2-5 | | | Insulating layer is not formed | | | | |
|  | 2-6 | Copper plate | Boron nitride | 170 | 4 | Polyimide | Copper | 5.11 |
|  | 2-7 | | | Insulating layer is not formed | | | | |
|  | 2-8 | Copper plate | Silica | 380 | 4 | Polyimide | Copper | 6.36 |
|  | 2-9 | | | Insulating layer is not formed | | | | |
|  | 2-10 | Copper plate | Silica | 6.2 | 4 | Polyimide | Copper | 5.31 |
|  | 2-11 | Copper plate | Silica | 6.2 | 8 | Polyimide | Copper | 4.90 |
|  | 2-12 | Copper plate | Silica | 6.2 | 20 | Polyimide | Copper | 4.74 |
|  | 2-13 | Copper plate | Silica | 6.2 | 30 | Polyimide | Copper | 4.32 |
|  | 2-14 | Copper plate | Silica | 6.2 | 50 | Polyimide | Copper | 3.96 |

TABLE 4-continued

| | | | | | | | |
|---|---|---|---|---|---|---|---|
| 2-15 | Copper plate | Silica | 6.2 | 60 | Polyimide | Copper | 3.59 |
| 2-16 | | | | Insulating layer is not formed | | | |

| | | | Evaluation | | | | |
|---|---|---|---|---|---|---|---|
| | | | Withstand voltage per unit film thickness | | Thermal conductivity | | |
| | | | Absolute | | Measured | | Performance value |
| | | | value (kV/mm) | Relative valve | valve (W/mK) | Relative valve | Measured valve | Relative valve |
| Examples | | 2-1 | 219 | 1.05 | 0.53 | 2.32 | 117 | 2.44 |
| | | 2-2 | 217 | 1.04 | 0.63 | 2.76 | 138 | 2.87 |
| | | 2-3 | 215 | 1.03 | 0.33 | 1.45 | 72 | 1.49 |
| | | 2-4 | 204 | 0.98 | 0.58 | 2.53 | 119 | 2.48 |
| | | 2-5 | 210 | 1.01 | 0.48 | 1.99 | 96 | 2.01 |
| | | 2-6 | 208 | 1.00 | 0.35 | 1.52 | 73 | 1.52 |
| | | 2-7 | 219 | 1.05 | 0.43 | 1.89 | 95 | 1.98 |
| | | 2-8 | 223 | 1.07 | 0.39 | 1.68 | 86 | 1.80 |
| | | 2-9 | 240 | 1.15 | 0.27 | 1.19 | 66 | 1.37 |
| | | 2-10 | 227 | 1.09 | 0.36 | 1.58 | 83 | 1.72 |
| | | 2-11 | 225 | 1.08 | 0.50 | 2.18 | 113 | 2.35 |
| | | 2-12 | 217 | 1.04 | 0.54 | 2.36 | 118 | 2.45 |
| | | 2-13 | 206 | 0.99 | 0.65 | 2.81 | 133 | 2.78 |
| | | 2-14 | 238 | 1.14 | 0.29 | 1.28 | 70 | 1.46 |
| | | 2-15 | 227 | 1.09 | 0.40 | 1.73 | 90 | 1.89 |
| | | 2-16 | 215 | 1.03 | 0.59 | 2.58 | 127 | 2.66 |
| | | 2-17 | 210 | 1.01 | 0.76 | 329 | 159 | 3.32 |
| | | 2-18 | 202 | 0.97 | 0.92 | 4.01 | 186 | 3.89 |
| | | 2-19 | 212 | 1.02 | 0.30 | 1.31 | 64 | 1.34 |
| | | 2-20 | 200 | 0.96 | 0.33 | 1.42 | 65 | 1.36 |
| | | 2-21 | 198 | 0.95 | 0.34 | 1.48 | 67 | 1.41 |
| | | 2-22 | 190 | 0.91 | 0.37 | 1.62 | 71 | 1.47 |
| | | 2-23 | 169 | 0.81 | 0.39 | 1.71 | 66 | 1.39 |
| | | 2-24 | 238 | 1.14 | 0.33 | 1.42 | 78 | 1.62 |
| | | 2-25 | 260 | 1.25 | 0.39 | 1.68 | 101 | 2.10 |
| | | 2-26 | 227 | 1.09 | 0.38 | 1.66 | 87 | 1.81 |
| | | 2-27 | 256 | 1.23 | 0.27 | 1.18 | 70 | 1.45 |
| | | 2-28 | 223 | 1.07 | 0.36 | 1.58 | 81 | 1.69 |
| | | 2-29 | 210 | 1.01 | 0.44 | 1.92 | 93 | 1.94 |
| | | 2-30 | 200 | 0.96 | 0.53 | 2.30 | 106 | 2.21 |
| | | 2-31 | 186 | 0.89 | 0.57 | 2.49 | 106 | 2.22 |
| Comparative examples | | 2-1 | 162 | 0.78 | 0.32 | 1.40 | 52 | 1.09 |
| | | 2-2 | 250 | 1.20 | 0.23 | 0.99 | 57 | 1.19 |
| | | 2-3 | | | Insulating layer is not formed | | | |
| | | 2-4 | 246 | 1.18 | 0.23 | 1.01 | 57 | 1.19 |
| | | 2-5 | | | Insulating layer is not formed | | | |
| | | 2-6 | 204 | 0.98 | 0.23 | 1.00 | 47 | 0.98 |
| | | 2-7 | | | Insulating layer is not formed | | | |
| | | 2-8 | 254 | 1.22 | 0.23 | 0.99 | 58 | 1.21 |
| | | 2-9 | | | Insulating layer is not formed | | | |
| | | 2-10 | 213 | 1.02 | 0.23 | 0.99 | 48 | 1.01 |
| | | 2-11 | 196 | 0.94 | 0.23 | 1.01 | 46 | 0.95 |
| | | 2-12 | 190 | 0.91 | 0.25 | 1.08 | 47 | 0.98 |
| | | 2-13 | 173 | 0.83 | 0.27 | 1.19 | 47 | 0.99 |
| | | 2-14 | 158 | 0.76 | 0.30 | 1.32 | 48 | 1.00 |
| | | 2-15 | 144 | 0.69 | 0.33 | 1.45 | 48 | 1.00 |
| | | 2-16 | | | Insulating layer is not formed | | | |

The heat dissipation circuit boards of the comparative examples 2-1 and 2-11 to 2-15 had performance values of 0.95 to 1.09 which were not sufficiently increased. It is presumed that this is because the withstand voltage is lowered when the specific surface area of the ceramic particles in the insulating layer is less than 10 m²/g.

The heat dissipation circuit boards of the comparative examples 2-2, 2-4. 2-6, 2-8 and 2-10 also had performance values of 0.98 to 1.21 which were not sufficiently increased. It is presumed that this is because the amount of the ceramic particles was less than 5 vol % and the thermal conductivity did not increase sufficiently.

In the ceramic particle-dispersed resin solution prepared in the comparative examples 2-3, 2-5, 2-7, 2-9, and 2-16, the insulating layer could not be formed. It is presumed that this is because the amount of the ceramic particles exceeds 60 vol %.

On this other hand, in the heat dissipation circuit boards of the examples 2-1 to 2-31, although the withstand voltage was slightly lower than that of the polyimide film without containing the filler, the thermal conductivity was significantly improved as compared to the polyimide film not containing the filler, and as a result, the performance value was increased to 1.3 times or more.

INDUSTRIAL APPLICABILITY

According to the present invention, industrial application is possible because it is possible to provide a heat dissipation circuit board having high heat radiation performance while maintaining the withstand voltage property, the heat resistance, the chemical resistance, and the mechanical properties.

REFERENCE LIST

10 Heat dissipation circuit board
11 Metal substrate
12 Insulating layer
13 Circuit layer

What is claimed is:

1. A heat dissipation circuit board comprising:
a metal substrate;
an insulating layer which is disposed on at least one surface of the metal substrate; and
a circuit layer which is disposed on a surface of the insulating layer opposite to the metal substrate,
wherein the insulating layer includes a resin formed of a polyimide, a polyamide-imide, or a mixture thereof, and ceramic particles,
the ceramic particles are a mixture of one or two or more kinds selected from silica particles, alumina particles, titanium oxide particles, alumina-doped silica particles, and alumina hydrate particles,
at least some of the ceramic particles form agglomerates, aggregates or a particle assembly,
an amount of the ceramic particles is in a range of 5 vol % to 60 vol %,
a mass average molecular weight of the resin is 100,000 to 500,000,
a specific surface area of the ceramic particles is 50 $m^2/g$ to 300 $m^2/g$,
a BET diameter of the ceramic particles is 1 nm to 200 nm,
an average particle diameter of the agglomerates, the aggregates or the particle assembly is 5 times to 100 times the BET diameter, and
the average particle diameter of the agglomerates, the aggregates or the particle assembly is a value of Dv50 measured by a laser diffraction type particle size distribution measuring device in an ultrasonic dispersion state of the ceramic particles in an NMP solvent together with a dispersant.

2. The heat dissipation circuit board according to claim 1, wherein the withstand voltage of the insulating layer is 186 to 260 kV/mm.

* * * * *